(12) United States Patent
Chang et al.

(10) Patent No.: US 12,015,076 B2
(45) Date of Patent: Jun. 18, 2024

(54) HEMT AND METHOD OF FABRICATING THE SAME

(71) Applicant: UNITED MICROELECTRONICS CORP., Hsin-Chu (TW)

(72) Inventors: Chih-Wei Chang, Tainan (TW); Yao-Hsien Chung, Kaohsiung (TW); Shih-Wei Su, Tainan (TW); Hao-Hsuan Chang, Kaohsiung (TW); Da-Jun Lin, Kaohsiung (TW); Ting-An Chien, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 58 days.

(21) Appl. No.: 18/092,916

(22) Filed: Jan. 3, 2023

(65) Prior Publication Data
US 2023/0145175 A1 May 11, 2023

Related U.S. Application Data

(62) Division of application No. 17/143,135, filed on Jan. 6, 2021, now Pat. No. 11,688,790.

(30) Foreign Application Priority Data

Nov. 26, 2020 (CN) .......................... 202011344582.7

(51) Int. Cl.
*H01L 29/66* (2006.01)
*H01L 29/20* (2006.01)
*H01L 29/423* (2006.01)
*H01L 29/778* (2006.01)

(52) U.S. Cl.
CPC .... *H01L 29/66462* (2013.01); *H01L 29/2003* (2013.01); *H01L 29/4236* (2013.01); *H01L 29/42364* (2013.01); *H01L 29/7786* (2013.01)

(58) Field of Classification Search
CPC ................................................ H01L 29/66462
See application file for complete search history.

(56) References Cited

U.S. PATENT DOCUMENTS

| | | |
|---|---|---|
| 5,258,631 A | 11/1993 | Usagawa |
| 8,841,702 B2 | 9/2014 | Mishra |
| 9,209,290 B2 | 12/2015 | Then |

(Continued)

*Primary Examiner* — Grant S Withers
(74) *Attorney, Agent, or Firm* — Winston Hsu

(57) ABSTRACT

A high electron mobility transistor includes a first III-V compound layer. A second III-V compound layer is disposed on the first III-V compound layer. The composition of the first III-V compound layer is different from that of the second III-V compound layer. A trench is disposed within the first III-V compound layer and the second III-V compound layer. The trench has a first corner and a second corner. The first corner and the second corner are disposed in the first III-V compound layer. A first dielectric layer contacts a sidewall of the first corner. A second dielectric layer contacts a sidewall of the second corner. The first dielectric layer and the second dielectric layer are outside of the trench. A gate is disposed in the trench. A source electrode and a drain electrode are respectively disposed at two sides of the gate. A gate electrode is disposed on the gate.

8 Claims, 5 Drawing Sheets

(56) References Cited

U.S. PATENT DOCUMENTS

| | | | |
|---|---|---|---|
| 2011/0147795 A1* | 6/2011 | Rachmady | H01L 29/78 |
| | | | 438/285 |
| 2013/0075751 A1 | 3/2013 | Imanishi | |
| 2014/0159117 A1 | 6/2014 | Taniguchi | |
| 2014/0264274 A1 | 9/2014 | Nakayama | |
| 2015/0021662 A1* | 1/2015 | Basu | H01L 29/7784 |
| | | | 438/285 |
| 2015/0243773 A1* | 8/2015 | Basu | H01L 29/205 |
| | | | 257/194 |
| 2016/0172474 A1* | 6/2016 | Miyake | H01L 29/66462 |
| | | | 438/172 |
| 2019/0280111 A1* | 9/2019 | Shimizu | H01L 29/4236 |
| 2020/0273751 A1* | 8/2020 | Dasgupta | H01L 29/402 |

* cited by examiner

HEMT AND METHOD OF FABRICATING THE SAME

CROSS REFERENCE TO RELATED APPLICATIONS

This application is a division of U.S. application Ser. No. 17/143,135, filed on Jan. 6th, 2021. The content of the application is incorporated herein by reference.

BACKGROUND OF THE INVENTION

1. Field of the Invention

The present invention relates to a structure and a fabricating method of preventing a high electron mobility transistor (HEMT) from gate leakage.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, current leakage is often occurred at corners around bottom of a gate of the HEMT, and an efficiency of the HENT is deteriorated.

SUMMARY OF THE INVENTION

According to a preferred embodiment of the present invention, an HEMT includes a first III-V compound layer, a second III-V compound layer disposed on the first III-V compound layer, wherein a composition of the first III-V compound layer is different from a composition of second III-V compound layer, a trench is disposed within the first III-V compound layer and the second III-V compound layer, wherein the trench has a first corner and a second corner both disposed within the first III-V compound layer, the first corner is formed by a first sidewall and a bottom and the second corner is formed by a second sidewall and the bottom. A first dielectric layer contacts the first sidewall and a second dielectric layer contacts the second sidewall, wherein the first dielectric layer and the second dielectric layer are both disposed outside of the trench. A gate is disposed in the trench. A source electrode is disposed at one side of the gate. A drain electrode is disposed at another side of the gate. A gate electrode is disposed directly on the gate.

According to another preferred embodiment of the present invention, a fabricating method of an HEMT includes providing a first III-V compound layer. Next, a recess is formed within the first III-V compound layer. Then, a dielectric layer is formed to fill up the recess. Later, a second III-V compound layer is formed to be disposed on the first III-V compound layer and contacts the dielectric layer, wherein a composition of the first III-V compound layer is different from a composition of second III-V compound layer. Subsequently, a trench is formed in the first III-V compound layer and the second III-V compound layer, wherein the trench separates the dielectric layer into a first dielectric layer and a second dielectric layer, and the first dielectric layer and the second dielectric layer are disposed respectively at two sides of the trench. After that, a gate is formed within the trench. Finally, a source electrode, a drain electrode and a gate electrode are formed, wherein the gate electrode is disposed directly on the gate, and the source electrode and the drain electrode are respectively disposed at two sides of the gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of an HEMT according to a preferred embodiment of the present invention, wherein:

FIG. 1 shows a substrate with a first III-V compound layer;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
and
FIG. 8 is a fabricating stage following FIG. 7.

DETAILED DESCRIPTION

Figure 1:

FIG. 1 to FIG. 8 depict a fabricating method of an HEMT according to a preferred embodiment of the present invention. As shown in FIG. 1, a substrate 10 is provided. Next, a first III-V compound layer 12 is formed to cover the substrate 10. The substrate 10 a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The first III-V compound layer 12 is preferably gallium nitride, and more specifically speaking, the first III-V compound layer 12 is advantageously non-doped gallium nitride. Based on different requirements, the first III-V compound layer 12 can be other III-V compounds such as aluminum gallium nitride, aluminum indium nitride, aluminum indium gallium nitride or aluminum nitride.

Figure 2:
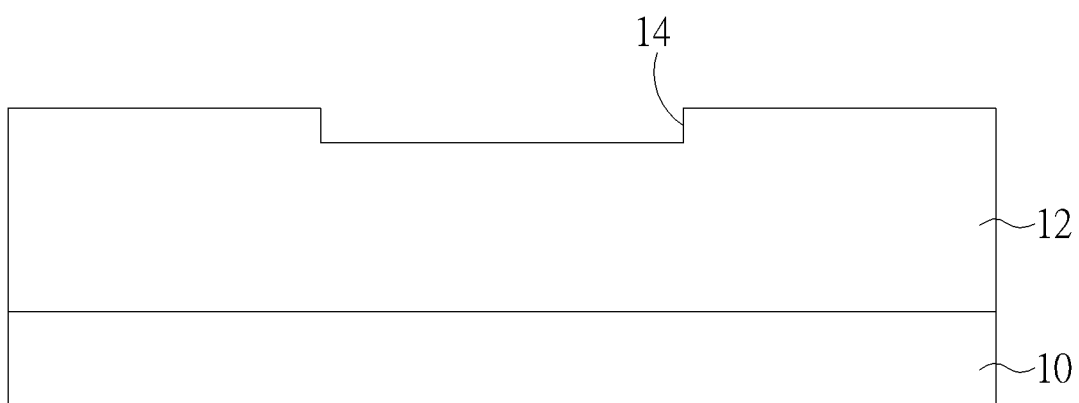
Figure 3:
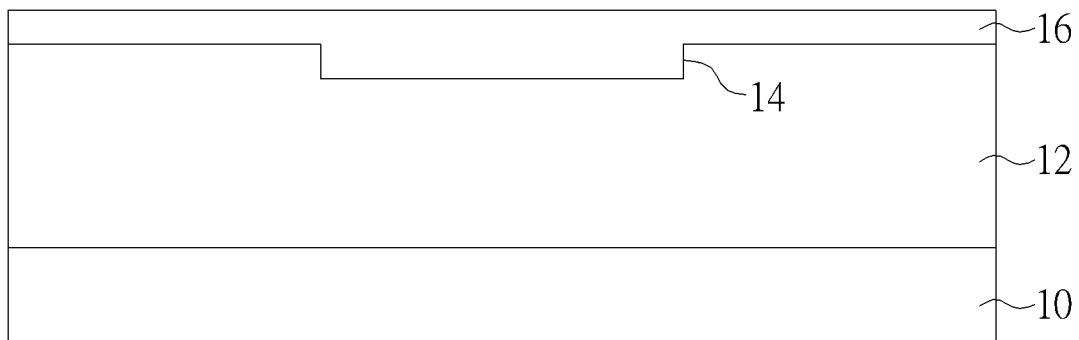

As shown in FIG. 2, a recess 14 is formed within the first III-V compound layer 12. As shown in FIG. 3, a dielectric layer 16 is formed to cover the first III-V compound layer 12 and fills up the recess 14. The dielectric layer 16 is preferably formed by a deposition process such as a chemical vapor deposition, a physical vapor deposition, an atomic layer deposition or other deposition process. The dielectric layer 16 includes SiN, $SiO_2$, SION, SiOCN, AlN, $Al_2O_3$, AlON or GaON. In this embodiment, the dielectric layer 16 is preferably AlN.

Figure 4:
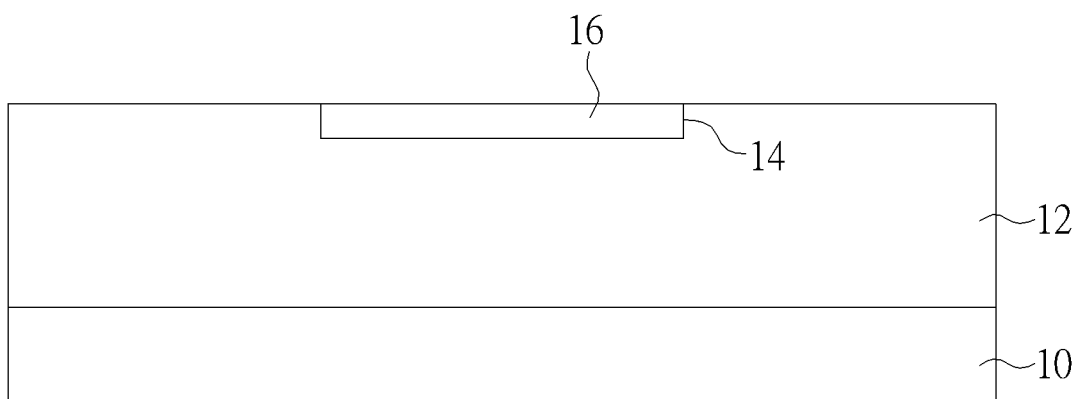
Figure 5:
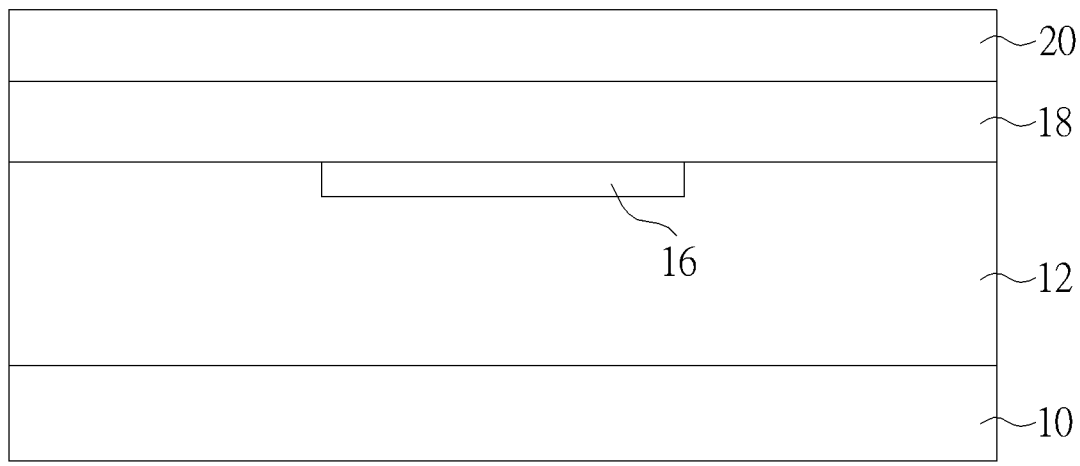

As shown in FIG. 4, the dielectric layer 16 outside of the recess 14 is removed, and the dielectric layer 16 within the recess 14 remains. Now, a top surface of the dielectric layer 16 and a top surface of the first III-V compound layer 12 are aligned. According to a preferred embodiment of the present intention, the dielectric layer 16 can be removed by a dry etching or a wet etching. As shown in FIG. 5, a second III-V compound layer 18 is formed on the first III-V compound layer 12, and the second III-V compound layer 18 contacts the dielectric layer 16. The composition of the first III-V compound layer 12 is different from the composition of the second III-V compound layer 18. The second III-V compound layer 18 includes aluminum gallium nitride, aluminum indium nitride, aluminum indium gallium nitride or aluminum nitride. Next, a protective layer 20 is formed optionally to cover the second III-V compound layer 18 based on different product requirements. The protective layer 20 may be dielectrics such as silicon oxide, silicon nitride, silicon carbide nitride, silicon oxynitride, silicon carboxynitride, or aluminum nitride. According to a preferred embodiment of the present invention, the protective layer 20 is preferably nitrogen-containing compound. The following processes will be illustrated with the protective layer 20 being formed as an example.

Figure 6:
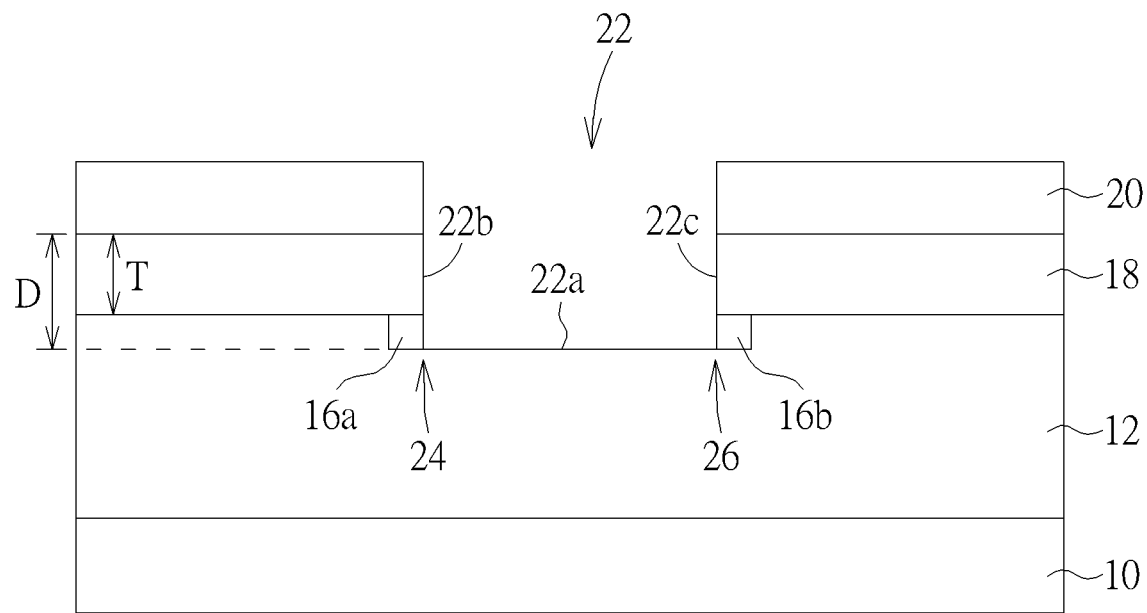

As shown in FIG. 6, a trench 22 is formed within the protective layer 20, the first III-V compound layer 12 and the second III-V compound layer 18. The trench 22 separates the dielectric layer 16 into a first dielectric layer 16a and a second dielectric layer 16b. The first dielectric layer 16a and the second dielectric layer 16b are respectively at two side of the trench 22. The steps of forming the trench 22 is preferably by using an etching process and the dielectric layer 16 serving as an etching stop layer. More specifically speaking, during the formation of the trench 22, the protective layer 20, the second III-V compound layer 18, the dielectric layer 18 and the first III-V compound layer 12 are etched in sequence. The trench 22 is located at a shallow region of the first III-V compound layer 12; therefore the point when the etching process reaching the dielectric layer 16 is taken as a signal for preparing to stop the etching process. That is, when the etching process reaches the dielectric layer 16, the etching process continues to etch the dielectric layer 16 for a little depth before it stops. In this way, the trench 22 will not be over etched. Furthermore, if the trench 22 has a high aspect ratio, the trench 22 is easily to become out of shape or misallocated during the etching process. Under this circumstance, the dielectric layer 16 can serve as a buffer layer to compensate the shape of the trench 22 or to limit the misallocation of the trench 22 to be within the dielectric layer 16 and keep neighboring materials from being etched.

According to a preferred embodiment of the present invention, the bottom 22a of the trench 22 is preferred within the first III-V compound layer 12. The trench 22 has a first corner 24 and a second corner 26 both disposed within the first III-V compound layer 12. The bottom 22a is aligned with a bottom of the first dielectric layer 16a and a bottom of the second dielectric layer 16b, but not limited thereto. In another embodiment, a depth of the bottom 22a of the trench 22 can be greater than the bottom of the first dielectric layer 16a and the bottom of the second dielectric layer 16b, but the first dielectric layer 16a and the second dielectric layer 16b are still disposed adjacent to the first corner 24 and the second corner 26.

Figure 7:
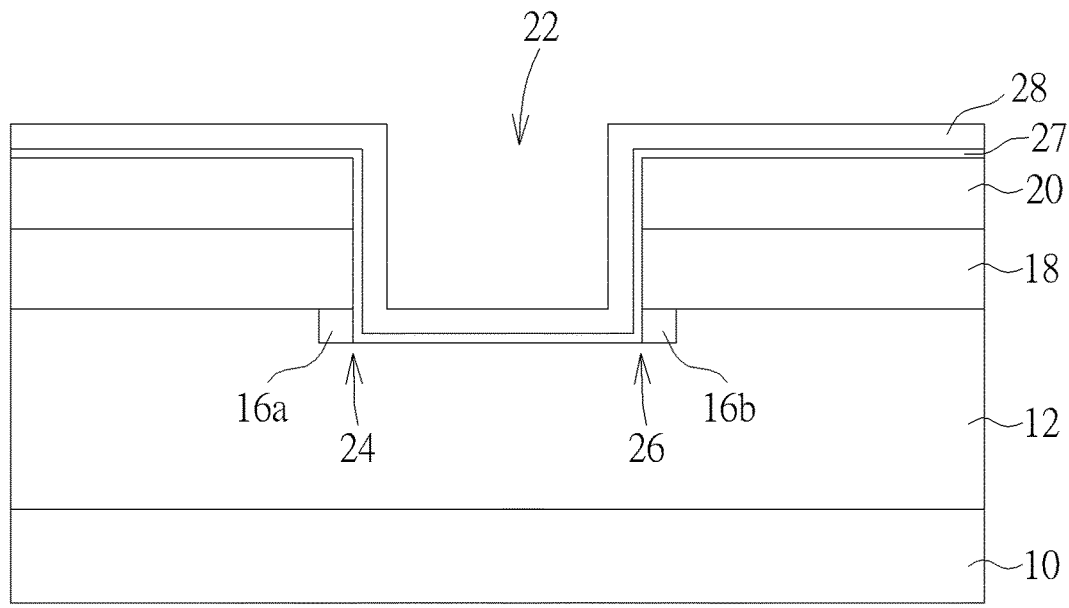
Figure 8:
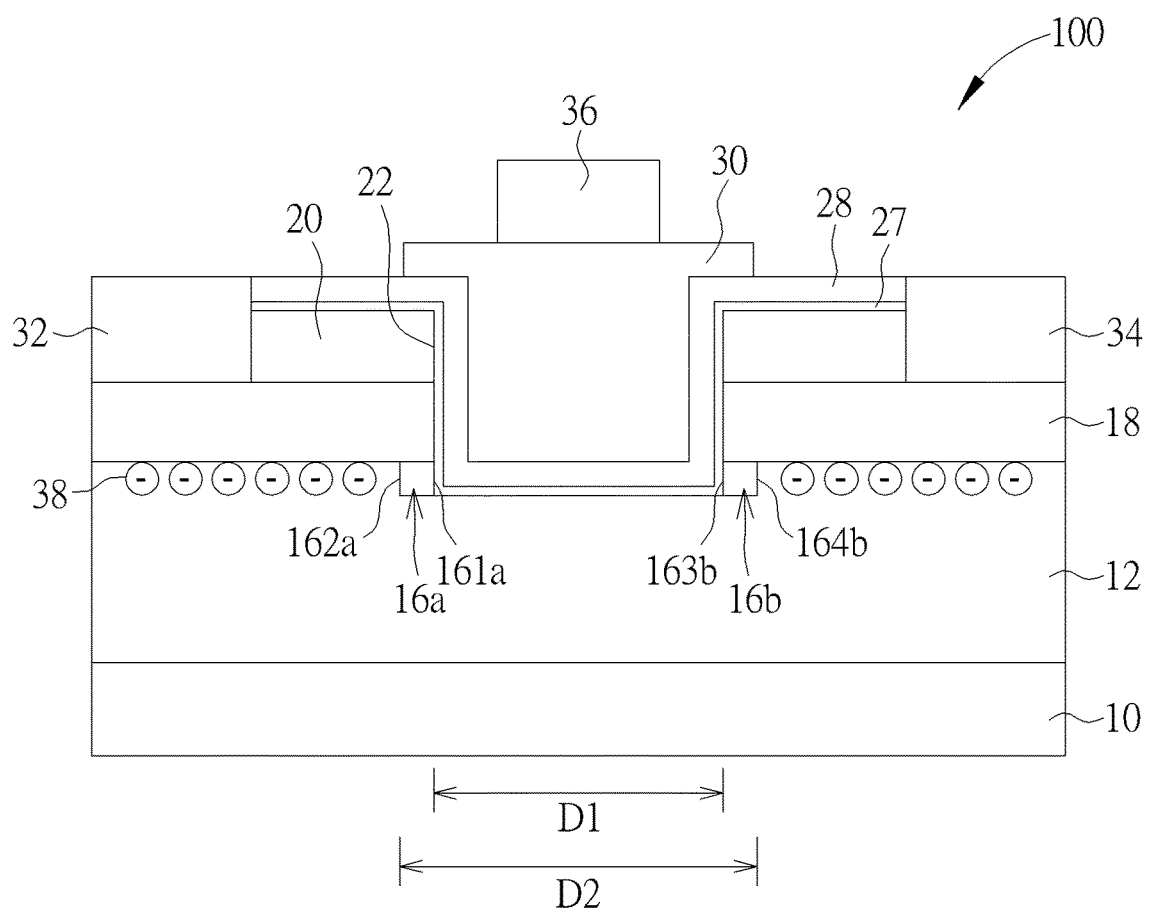

As shown in FIG. 7, a dielectric layer 27 is optionally formed to cover the protective layer 20 and conformally cover the trench 22. The dielectric layer 27 is preferably aluminum nitride. The following processes are illustrated as the dielectric layer 27 being formed as an example. After forming the dielectric layer 27, a third III-V compound layer 28 is formed on the dielectric layer 27, covers the protective layer 20 and conformally covers the trench 22. A composition of the first III-V compound layer 12 is different from a composition of third III-V compound layer 28. The third III-V compound layer 28 includes aluminum gallium nitride, aluminum indium nitride, aluminum indium gallium nitride or aluminum nitride. According to a preferred embodiment of the present invention, the third III-V compound layer 28 is aluminum gallium nitride. Moreover, before forming the third III-V compound layer 28, a dielectric layer (not shown) can be formed to cover the protective layer 20 and conformally covers the trench 22. As shown in FIG. 8, a gate 30 is formed with in the trench 22. The gate 30 is a P-type doped III-V compound layer. The P-type doped III-V compound layer and the first III-V compound layer 12 are preferably formed by the same composition of group III-V elements. For instance, the first III-V compound layer 12 is gallium nitride. The gate 30 is P-type doped gallium nitride. Subsequently, a source electrode 32, a drain electrode 34 and a gate electrode 36 are formed. The gate electrode 36 is disposed directly on the gate 30 and contacts the gate 30. The source electrode 32 and the drain electrode 34 are respectively disposed at two sides of the gate 30. The source electrode 32 and the drain electrode 34 contact the second III-V compound layer 18. Now, a normally-off HEMT 100 of the present invention is completed.

Figure 9:
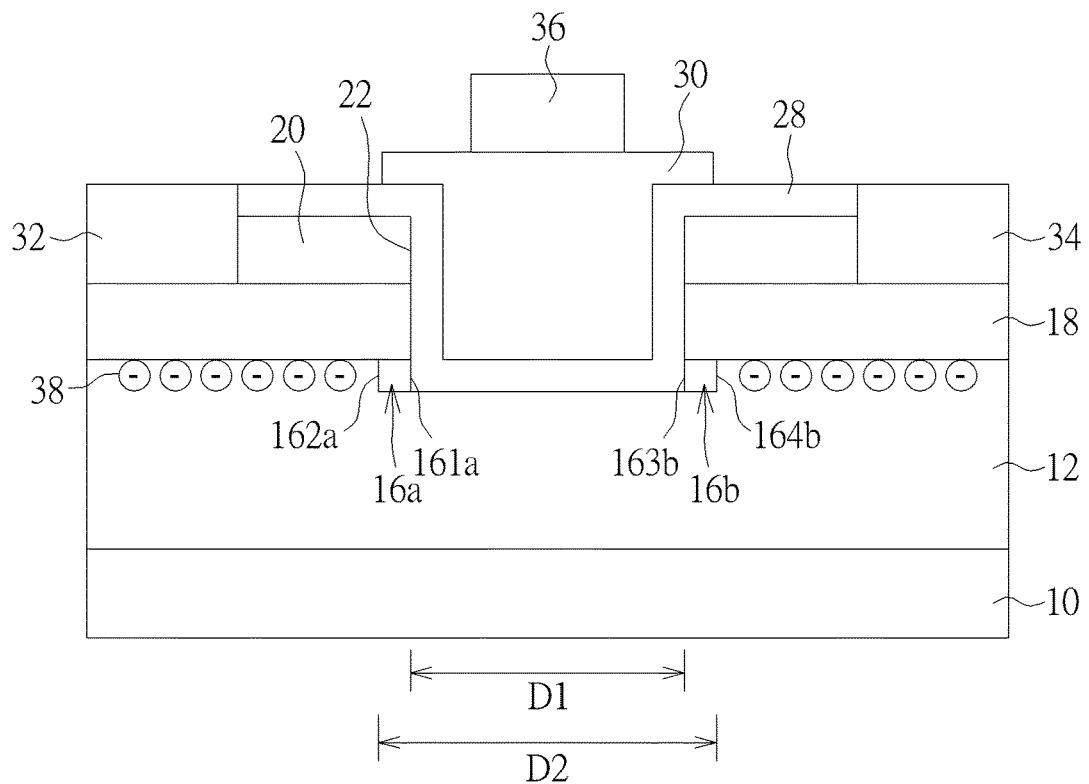
FIG. 9 depicts an HEMT according to another preferred embodiment of the present invention.
Figure 10:
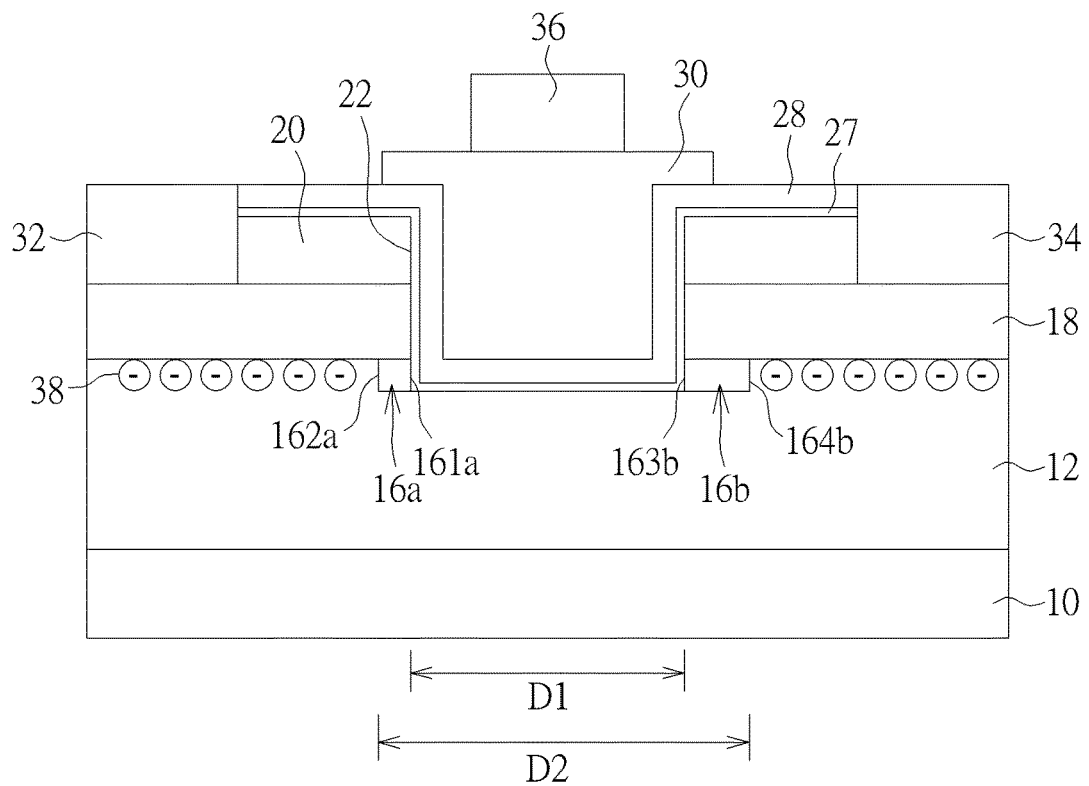
FIG. 10 depicts an HEMT according to yet another preferred embodiment of the present invention.

FIG. 8 depicts an HEMT according to a preferred embodiment of the present invention. FIG. 9 depicts an HEMT according to another preferred embodiment of the present invention. FIG. 10 depicts an HEMT according to yet another preferred embodiment of the present invention. In FIG. 9 and FIG. 10, elements which are substantially the same as those in the embodiment of FIG. 8 are denoted by the same reference numerals; an accompanying explanation is therefore omitted.

As shown in FIG. 6 and FIG. 8, a HEMT 100 includes a substrate 10, and a first III-V compound layer 12 is disposed on the substrate 10. A second III-V compound layer 18 is disposed on the first III-V compound layer 12. A composition of the first III-V compound layer 12 is different from a composition of second III-V compound layer 18. A two-dimensional electron gas (2DEG) 38 is disposed within the first III-V compound layer 12. A trench 22 is disposed within the first III-V compound layer 12 and the second III-V compound layer 18. The trench 22 has a first corner 24 and a second corner 26 both disposed within the first III-V compound layer 12. The first corner 24 is formed by a first sidewall 22b and a bottom 22a of the trench 22 and the second corner is formed by a second sidewall 22c and the bottom 22a of the trench 22. The bottom 22a entirely contacts the first III-V compound layer 12. A first dielectric layer 16a contacts the first sidewall 22b and a second dielectric layer 16b contacts the second sidewall 22c. It is noteworthy that the first dielectric layer 16a and the second dielectric layer 16b are both disposed outside of the trench 22. A gate is disposed in the trench 22. A source electrode 32 is disposed at one side of the gate 30 and contacts the second III-V compound layer 18. A drain electrode 34 is disposed at another side of the gate 30 and contacts the second III-V compound layer 18. A gate electrode 36 is disposed directly on the gate 30 and contacts the gate 30.

A third III-V compound layer 28 is disposed within the trench 22 and between the trench 22 and the gate 30. A dielectric layer 27 can be optionally disposed between the third III-V compound layer 28 and the trench 22. The structure of an HEMT without the dielectric layer 27 is shown in FIG. 9. As shown in FIG. 9, a part of the third III-V compound layer 28 contacts the first III-V compound layer 12. The third III-V compound layer 28 at the bottom 22a of the trench 22 is to increase current of HEMT 100. A protective layer 20 is optionally disposed on the second III-V compound layer 20. When there is the protective layer 20, the trench 22 is also disposed within the protective layer 20.

The first dielectric layer 16a has a first surface 161a and a second surface 162a, the first surface 161a contacts the first sidewall 22b, the first surface 161a faces the second surface 162a, the second dielectric layer 16b has a third surface 163b and a fourth surface 164b, the third surface 163b contacts the second sidewall 22c, the third surface 163b faces the fourth surface 164b, a first distance D1 is between the first surface 161a and the third surface 163b, a second distance D2 is between the second surface 162a and the fourth surface 164b, the second distance D2 is 1.01 to 1.2 times of the first distance D1. A width of the first dielectric layer 16a and a width of the second dielectric layer 16b can be the same or different. In other words, the sizes of the first dielectric layer 16a and the second dielectric layer 16b are not limited as long as there are the first dielectric layer 16a and the second dielectric layer 16b around the first corner 24 and the second corner 26. FIG. 8 is exemplified as the width of the first dielectric layer 16a and the width of the second dielectric layer 16b are the same. On the other hand, as shown in FIG. 10, the width of the first dielectric layer 16a is smaller than the width of the second dielectric layer 16b. That is, the width of the second dielectric layer 16b which is closer the drain electrode 34 is greater. The first electric layer 16a and the second electric layer 16b respectively include SIN, $SiO_2$, SION, SiOCN, AlN, $Al_2O_3$, AlON or GaON. According to a preferred embodiment of the present invention, the first dielectric layer 16a and the second dielectric layer 16b are made of the same material such as AlN.

Because electrons often gather around two corners below the gate 30, the first dielectric layer 16a and the second dielectric layer 16b are specially formed adjacent to the two corners to prevent current leakage. Moreover, the stress often accumulated at the first corner 24 and the second corner 26 and the stress will cause cracks. By forming the first dielectric layer 16a and the second dielectric layer 16b, the cracks can be prevented.

It is noteworthy that the bottom 22a of the trench 22 is entirely contacts the first III-V compound layer 12. That is, there is no dielectric layer between the bottom 22a and the first III-V compound layer 12. If there is a dielectric layer on the bottom 22a, on-resistance of HEMT 100 will be increased.

Moreover, shown in FIG. 6, the trench 22 within the first III-V compound layer 12 and within the second III-V compound layer 18 has a depth D. The second III-V compound layer 18 has a thickness T. The size of the depth D influences the resistance of the channel of the HEMT 100. When the depth D is greater, the turn-on voltage of the HEMT 100 is increased; therefore, the power consumption of the HEMT 100 is raised. According to a preferred embodiment of the present invention, when the depth D is 1.05 to 1.8 times of the thickness T, the HEMT 100 has a better efficiency.

The first III-V compound layer 12 includes aluminum gallium nitride, aluminum indium nitride, aluminum indium gallium nitride or aluminum nitride. The second III-V compound layer 18 includes aluminum gallium nitride, aluminum indium nitride, aluminum indium gallium nitride or aluminum nitride. The third III-V compound layer 28 includes aluminum gallium nitride, aluminum indium nitride, aluminum indium gallium nitride or aluminum nitride. The gate 30 is a P-type doped III-V compound layer. The P-type doped III-V compound layer and the first III-V compound layer 12 are formed by the same composition of group III-V elements.

In this embodiment, the first III-V compound layer 12 is gallium nitride. The second III-V compound layer 18 is aluminum gallium nitride. The third III-V compound layer 28 is aluminum gallium nitride. The gate 30 is P-type gallium nitride. The protective layer 20 includes silicon oxide, silicon nitride, silicon carbide nitride, silicon oxynitride, silicon carboxynitride, or aluminum nitride. The protective layer 20 is preferably nitrogen-containing compound. In other embodiment, the first III-V compound layer 12, the second III-V compound layer 18 and the third III-V compound layer 28 can be made by chemical compounds with the same group III element and the same group V element but different ratios of the group III element to the group V element. The source electrode 32, the drain electrode 34 and the gate electrode 36 respectively includes titanium, aluminum, platinum or gold.

The first dielectric layer 16a and the second dielectric layer 16b are specially disposed at two sides of the trench 22 which contains the gate 30. In this way, the current leakage around corners at the bottom of the gate 30 can be prevented. Moreover, the first dielectric layer 16a and the second dielectric layer 16b can compensate defects of the first corner 24 and the second corner 26 occurred during fabricating process, and stress around the first corner 24 and the second corner 26 can also be dispersed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a high electron mobility transistor (HEMT), comprising:
   providing a first III-V compound layer;
   forming a recess within the first III-V compound layer;
   forming a dielectric layer filling up the recess;
   forming a second III-V compound layer disposed on the first III-V compound layer and contacting the dielectric layer, wherein a composition of the first III-V compound layer is different from a composition of second III-V compound layer;
   forming a trench in the first III-V compound layer and the second III-V compound layer, wherein the trench separates the dielectric layer into a first dielectric layer and a second dielectric layer, and the first dielectric layer and the second dielectric layer are disposed respectively at two sides of the trench;
   forming a gate within the trench;
   forming a source electrode, a drain electrode and a gate electrode, wherein the gate electrode is disposed directly on the gate, and the source electrode and the drain electrode are respectively disposed at two sides of the gate.

2. The fabricating method of the HEMT of claim 1, further comprising: before forming the trench, forming a protective layer covering the second III-V compound layer.

3. The fabricating method of the HEMT of claim 2, wherein the trench is disposed within the protective layer, the second III-V compound layer and the first III-V compound layer.

4. The fabricating method of the HEMT of claim 1, further comprising before forming the gate, forming a third III-V compound layer contacting the trench, wherein the third III-V compound layer and the second III-V compound layer are formed by the same composition of group III-V elements.

5. The fabricating method of the HEMT of claim 1, wherein the first III-V compound layer is gallium nitride, the second III-V compound layer comprises aluminum gallium nitride, aluminum indium nitride, aluminum indium gallium nitride or aluminum nitride.

6. The fabricating method of the HEMT of claim 1, wherein the trench has a first corner and a second corner both disposed within the first III-V compound layer, the first corner is formed by a first sidewall and a bottom of the trench, the second corner is formed by a second sidewall and the bottom of the trench, the first dielectric layer contacts the first sidewall and the second dielectric layer contacts the second sidewall, and the first dielectric layer and the second dielectric layer are both disposed outside of the trench.

7. The fabricating method of the HEMT of claim 1, wherein the gate is a P-type doped III-V compound layer, the P-type doped III-V compound layer and the first III-V compound layer are formed by the same composition of group III-V elements.

8. The fabricating method of the HEMT of claim 1, wherein the first electric layer comprises SiN, $SiO_2$, SiON, SiOCN, AlN, $Al_2O_3$, AlON or GaON and the second electric layer comprises SiN, $SiO_2$, SiON, SiOCN, AlN, $Al_2O_3$, AlON or GaON.

* * * * *